(12) United States Patent
Schober et al.

(10) Patent No.: US 6,593,664 B2
(45) Date of Patent: Jul. 15, 2003

(54) CHIP MODULE WITH BOND-WIRE CONNECTIONS WITH SMALL LOOP HEIGHT

(75) Inventors: Joachim Schober, Graz (AT); Marcus Toth, Gratkorn (AT)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/099,682

(22) Filed: Mar. 15, 2002

(65) Prior Publication Data

US 2002/0135078 A1 Sep. 26, 2002

(30) Foreign Application Priority Data

Mar. 23, 2001 (EP) .............................. 01890093

(51) Int. Cl.⁷ .................. H01L 23/48; H01L 23/52; H01L 29/40
(52) U.S. Cl. .................. 257/784; 257/782; 257/786
(58) Field of Search .................. 257/784, 679, 257/782, 780, 781, 786

(56) References Cited

U.S. PATENT DOCUMENTS

| | | | |
|---|---|---|---|
| 5,101,263 A | * | 3/1992 | Kitano et al. |
| 5,455,461 A | * | 10/1995 | Koide et al. |
| 5,874,354 A | | 2/1999 | Heitzer et al. |
| 6,232,561 B1 | * | 5/2001 | Schmidt et al. |
| 6,372,625 B1 | * | 4/2002 | Shigeno et al. |

FOREIGN PATENT DOCUMENTS

| | | | |
|---|---|---|---|
| EP | 0397426 A2 | 5/1990 | ............ H01L/21/60 |
| EP | 0397462 | 11/1990 | ............ H01L/21/60 |
| WO | WO 9821780 | 11/1997 | ............ H01R/4/00 |

* cited by examiner

*Primary Examiner*—Sheila V. Clark
(74) *Attorney, Agent, or Firm*—Steven R. Biren

(57) ABSTRACT

In a data carrier (1) with a chip module (3), the chip (5) of the chip module (3) is provided, in the region of its chip connecting layers (8), with a respective wire connecting means which is formed by a flat metal layer (10) and whereto an end (13), bonded in a wedge-shape fashion, of a bond wire (11) is connected.

7 Claims, 1 Drawing Sheet

CHIP MODULE WITH BOND-WIRE CONNECTIONS WITH SMALL LOOP HEIGHT

BACKGROUND OF THE INVENTION

The invention relates to a chip module and to a data carrier with a chip module, the chip module having a holder means with holder means connecting layers and a chip with chip connecting layers, which connecting layers are connected to one another with the aid of bond wires, each chip connecting layer being provided with a wire connecting means whereto an end bonded in a wedge-shape fashion of a bond wire is connected.

A chip module as mentioned above is illustrated and described in Patent document EP 0 397 426 A2. In the known chip module, an end bonded in a spherical fashion of a bond wire is provided on each chip connecting layer as wire connecting means; this is frequently called a "nail bond" in the technical language. In a plan view of the chip connecting layer on which the "nail bond" is provided, such a "nail bond" has a smaller dimension than the chip connecting layer lying under it. Furthermore, in a direction perpendicular to the chip connecting layer lying under it, such a "nail bond" has a relatively large dimension, that is to say a relatively large height. The small area of such a "nail bond" is attended by the problem that during the bonding operation in which the end bonded in a wedge-shape fashion of a bond wire is connected to the "nail bond", the bond wire has to be fed very precisely to the "nail bond", in order to ensure that the connection is made reliably. The large height of such a "nail bond" unfortunately has an unfavorable influence on the overall height of the chip module or of the data carrier containing the chip module, which data carrier can be formed, for example, by embedding the chip module in a plastic sleeve as mentioned in Patent document EP 0 397 426 A2. The fabrication of such a "nail bond" entails a relatively long period for the wire bonding method, because such a "nail bond" must be fabricated in the course of the wire bonding method.

SUMMARY OF THE INVENTION

It is an object of the invention to avoid the described drawbacks and to implement an improved chip module and an improved data carrier with such a chip module.

In order to achieve the object set forth above, inventive features are provided to a chip module in accordance with the invention such that a chip module in accordance with the invention can be characterized as follows:
a chip module with a holder means and with a chip connected to the holder means, where the chip has at least one chip connecting layer, and where the holder means has at least one holder means connecting layer, and where an associated wire connecting means is provided on the chip connecting layer, and where the wire connecting means and the holder means connecting layer are connected to one another with the aid of a bond wire, and where the bond wire has a bonded first end and a second end bonded in a wedge-shape fashion, and where the bonded first end is connected to the holder means connecting layer and the second end bonded in a wedge-shape fashion is connected to the wire connecting means, and where a flat metal layer extending parallel to the chip connecting layer is provided as the wire connecting means.

In order to achieve the object set forth above, inventive features are provided to a data carrier in accordance with the invention such that a data carrier in accordance with the invention can be characterized as follows:
a data carrier with a chip module with a holder means and with a chip connected to the holder means, where the chip has at least one chip connecting layer, and where the holder means has at least one holder means connecting layer, and where an associated wire connecting means is provided on the chip connecting layer, and where the wire connecting means and the holder means connecting layer are connected to one another with the aid of a bond wire, and where the bond wire has a bonded first end and a second end bonded in a wedge-shape fashion, and where the bonded first end is connected to the holder means connecting layer and the second end bonded in a wedge-shape fashion is connected to the wire connecting means, and where a flat metal layer extending parallel to the chip connecting layer is provided as the wire connecting means.

Because of the provision of the features in accordance with the invention it is achieved in a structurally simple and suitably reproducible manner, that the wedge-shape bond to be fabricated between an end, to be bonded in a wedge-shape fashion, of the bond wire and a wire connecting means can be fabricated with far less precision with regard to feeding the bond wire to the metal layer provided as the wire connecting means than in the case of the known solution described above. Furthermore, as a result of the steps taken according to the invention each wire connecting means takes up significantly less space in a direction perpendicular to the chip connecting layer lying under a wire connecting means than in the case of the known prior art described above. In a chip module in accordance with the invention, and in a data carrier in accordance with the invention, there is, moreover, the advantage that each wire connecting means can be fabricated by way of a method which is independent of the wire bonding method, and is carried out before the wire bonding method, thus offering the advantage that the wire bonding method can be carried out in a substantially shorter period of time than in the case of fabrication of the known chip module described above; consequently the so-called throughput or step duration in the manufacture of a chip module can be shortened substantially in accordance with the invention by comparison with the known method.

In a chip module in accordance with the invention and in a data carrier in accordance with the invention, the metal layer provided on a chip connecting layer can, given an appropriately sized area of the chip connecting layer, cover only a part of the chip connecting layer and in so doing nevertheless take up a sufficiently large area which ensures no complications in feeding the end to be bonded in a wedge-shape fashion to the metal layer provided as the wire connecting means. However, it has proved to be particularly advantageous when the features in accordance with claim 2 or claim 5 are provided in addition. The largest possible area is thus advantageously achieved for the metal layer which additionally also further fulfills a protective function for the entire chip connecting layer.

In a chip module in accordance with the invention and in a data carrier in accordance with the invention, each metal layer provided as the wire connecting means can consist of silver or tin. However, it has proved to be particularly advantageous when each metal layer provided as the wire connecting means consists of gold.

The aspects set forth above and further aspects of the invention emerge from the exemplary embodiments described below and are explained with the aid of these exemplary embodiments.

BRIEF DESCRIPTION OF THE DRAWING

The invention is further described below with the aid of two exemplary embodiments illustrated in the drawings, to which, however, the invention is not limited.

DESCRIPTION OF THE PREFERRED EMBODIMENT

Figure 1:
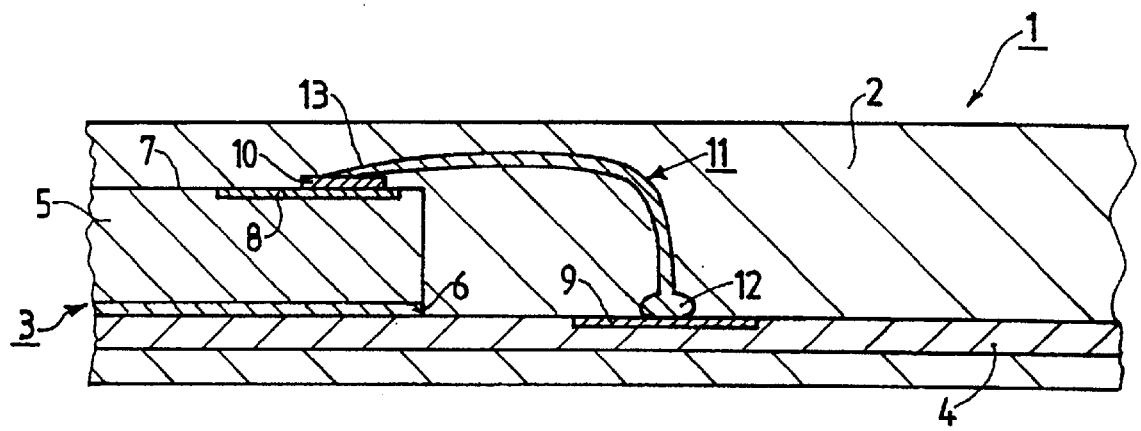
FIG. 1 is a schematic cross-sectional view of a data carrier in accordance with a firs exemplary embodiment of the invention.

A data carrier 1 is illustrated in FIG. 1. The data carrier 1 has a data carrier body 2 which is fabricated using a plastic injection molding process. The card body 2 can, however, also be fabricated in any other known way, for example, in what is termed a lamination process.

Accommodated in the data carrier 1 is a chip module 3 which, like the data carrier 1, is shown only partially. The chip module 3 has a support plate 4 which forms a holder means for a chip 5 of the chip module 3. The chip 5 is connected to the support plate 4, specifically with the aid of an adhesive layer 6. On its side 7 averted from the adhesive layer 6, the chip 5 has two chip connecting layers 8 of which, however, only one chip connecting layer 8 is shown in FIG. 1. However, such a chip 5 can also have more than two chip connecting layers, as is generally known. In the case of the chip module 3, by analogy with the chip 5 with two chip connecting layers 8, the support plate 4 has two support plate connecting layers 9, of which only one holder means connecting layer 9 is illustrated in FIG. 1. In the present case—although this need not necessarily be so—the holder means connecting layers 9 are constituents of a transmission coil that is implemented with the aid of conductor tracks, is a constituent of the data carrier 1, and is provided for the purpose of contactless communication of the data carrier 1 with an appropriate communication station. The holder means connecting layers 9 can also be formed by sections of what is termed a conductor frame, the holder means connecting layers 9 and the remaining part of the conductor frame then consisting of one piece or of one material, specifically metal.

An associated wire connecting means 10 is provided on each of the two chip connecting layers 8 and is formed in a particularly advantageous way in the chip module 3 in accordance with FIG. 1 by a flat metal layer 10 which extends parallel to the relevant chip connecting layer 8 and is advantageously made of gold. Each of the two wire connecting means 10, that is, each of the two metal layers 10, is connected to a support plate connecting layer 9 with the aid of a bond wire 11.

Each bond wire 11 has a first end 12, bonded in this case in the shape of a ball, and a second end 13 which is bonded in a wedge-shape fashion. Each first end 12 bonded in the shape of a ball is then connected to a support plate connecting layer 9, and each second end 13 bonded in a wedge-shape fashion is connected to a wire connecting means 10, that is, to a flat metal layer 10. In the design in accordance with FIG. 1, each metal layer 10 covers only part of the chip connecting layer 8 lying thereunder.

Figure 2:
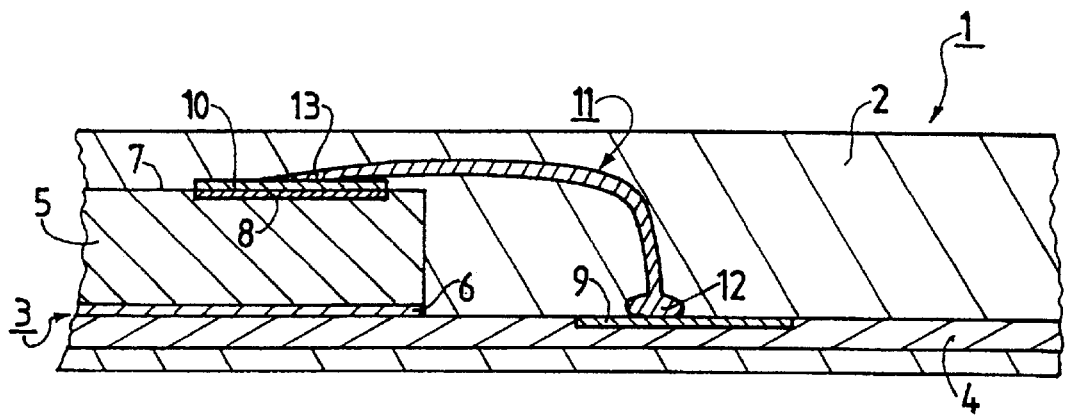
FIG. 2 shows, in a similar way to FIG. 1, a data carrier in accordance with a second exemplary embodiment of the invention.

In the case of the data carrier 1 illustrated in FIG. 2, each metal layer 10 covers the chip connecting layer 8 lying thereunder entirely; this offers the advantage of an as large a metal layer 10 as possible and also the advantage that the metal layer 10 protects the chip connecting layer 8 effectively. In a modified version of a data carrier 1 in accordance with FIG. 2, the area of the chip connecting layer 8 can be smaller than the metal layer 10 lying thereabove; this offers the advantage that an as small as possible connecting layer 8 suffices; this is advantageous with regard to implementation with an as small as possible a chip surface. Despite the small area of the chip connecting layer 8, a good electrical connection with the bond wire 11 is then ensured with the aid of the metal layer 10, which has a large area in comparison with the chip connecting layer 8.

In the two data carriers 1 in accordance with the FIGS. 1 and 2, it is advantageously achieved that the wire connecting means 10 are designed with a very low overall height and have a large surface area; this is advantageous with regard to achieving an as small as possible overall height of the data carrier 1 and/or the chip module 3, and with regard to achieving bonding that is as uncomplicated as possible in the region of the metal layers 10.

Among experts, a chip connecting layer 8 as described above is frequently also termed a "pad", and a metal layer 10 as described above is frequently also termed a "straight wall bump" or a "straight wall gold bump". In practice, such a pad has a thickness of approximately 1.0 $\mu$m while such a straight wall bump has a thickness in a range of between 10.0 $\mu$m and 18.0 $\mu$m as compared with an end, bonded in the shape of a ball, of a bond wire, which end bonded in the shape of a ball has a thickness or height of at least 30.0 $\mu$m; this means that an advantageous reduction in the overall height by at least 12.0 $\mu$m is achieved by the design in accordance with the invention.

What is claimed is:

1. A chip module (3) with a holder means (4) and with a chip (5) connected to the holder means (4), where the chip (5) has at least one chip connecting layer (8), and where the holder means (4) has at least one holder means connecting layer (9), and where an associated wire connecting means (10) is provided on the chip connecting layer (8), and where the wire connecting means (10) and the holder means connecting layer (9) are connected to one another with the aid of a bond wire (11), and where the bond wire (11) has a bonded first end (12) and a second end (13) bonded in a wedge-shape fashion, and where the bonded first end (12) is connected to the holder means connecting layer (9) and the second end (13) bonded in a wedge-shape fashion is connected to the wire connecting means (10), and where a flat metal layer (10) extending parallel to the chip connecting layer (8) is provided as the wire connecting means (10), said flat metal layer (10) comprising a straight wall bump.

2. A chip module (3) as claimed in claim 1, where the flat metal layer (10) provided on the chip connecting layer (8) covers the chip connecting layer (8) entirely.

3. A chip module (3) as claimed in claim 1, where the flat metal layer (10) consists of gold.

4. A data carrier (1) with a chip module (3) with a holder means (4) and with a chip (5) connected to the holder means (4), where the chip (5) has at least one chip connecting layer (8), and where the holder means (4) has at least one holder means connecting layer (9), and where an associated wire connecting means (10) is provided on the chip connecting layer (8), and where the wire connecting means (10) and the holder means connecting layer (9) are connected to one another with the aid of a bond wire (11), and where the bond wire (11) has a bonded first end (12) and a second end (13) bonded in a wedge-shape fashion, and where the bonded firs end (12) is connected to the holder means connecting layer (9) and the second end (13) bonded in a wedge-shape fashion is connected to the wire connecting means (10), and where a flat metal layer (10) extending parallel to the chip connecting layer (8) is provided as the wire connecting means (10), said flat metal layer (10) comprising a straight wall bump.

5. A data carrier (1) as claimed in claim 4, where the flat metal layer (10) provided on the chip connecting layer (8) covers the chip connecting layer (8) entirely.

6. A data carrier (1) as claimed in claim 4, where the flat metal layer (10) consists of gold.

7. A chip module (3) as claimed in claim 1, wherein the straight wall bump (10) has a thickness in a range of between 01.0 and 18.0 $\mu$m.

\* \* \* \* \*